US010210931B2

(12) United States Patent
Kim

(10) Patent No.: US 10,210,931 B2
(45) Date of Patent: Feb. 19, 2019

(54) NONVOLATILE MEMORY DEVICE INCLUDING REFERENCE MEMORY CELL WITH FIXED STATE

(71) Applicant: SAMSUNG ELECTRONICS CO., LTD., Suwon-si (KR)

(72) Inventor: Daeshik Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/612,040

(22) Filed: Jun. 2, 2017

(65) Prior Publication Data

US 2018/0137913 A1 May 17, 2018

(30) Foreign Application Priority Data

Nov. 14, 2016 (KR) ........................ 10-2016-0151421

(51) Int. Cl.
*G11C 13/00* (2006.01)

(52) U.S. Cl.
CPC ........ *G11C 13/004* (2013.01); *G11C 13/0028* (2013.01); *G11C 13/0069* (2013.01); *G11C 2013/0042* (2013.01); *G11C 2013/0045* (2013.01); *G11C 2013/0054* (2013.01); *G11C 2213/79* (2013.01); *G11C 2213/82* (2013.01)

(58) Field of Classification Search
CPC .............. G11C 13/004; G11C 13/0028; G11C 13/0069
See application file for complete search history.

(56) References Cited

U.S. PATENT DOCUMENTS 6,853,599 B2 2/2005 Oh et al.
7,453,719 B2 11/2008 Sakimura et al.
7,495,955 B2 * 2/2009 Ido ........................... G11C 8/08 365/185.02
7,706,176 B2 4/2010 Dittrich
8,040,718 B2 * 10/2011 Ueda ....................... G11C 11/16 365/148
8,665,638 B2 3/2014 Rao et al.
8,687,412 B2 4/2014 Chih et al.
9,025,367 B1 5/2015 Lin
9,406,366 B2 8/2016 Aoki
2004/0066678 A1 4/2004 Oh et al.
2006/0227598 A1 10/2006 Sakimura et al.
(Continued)

FOREIGN PATENT DOCUMENTS

JP 2006-210396 A 8/2006

*Primary Examiner* — Tri M Hoang
(74) *Attorney, Agent, or Firm* — Sughrue Mion, PLLC

(57) ABSTRACT

A nonvolatile memory device includes: first memory cells connected to a first source line and a first bit line; second memory cells connected to a second source line and a second bit line; and a sense amplifier circuit connected to the first and second source lines and the first and second bit lines. The sense amplifier circuit includes: a first sense amplifier configured to apply a first read voltage to the first bit line and output a first amount of current of a selected first memory cell; a second sense amplifier configured to apply a second read voltage to the second bit line and output a second amount of current of a selected second memory cell; and a comparator configured to compare the first amount of current with the second amount of current to identify data of the selected first memory cell.

18 Claims, 10 Drawing Sheets

(56) References Cited

U.S. PATENT DOCUMENTS

| | | | |
|---|---|---|---|
| 2009/0175108 | A1 | 7/2009 | Dittrich |
| 2013/0016553 | A1 | 1/2013 | Rao et al. |
| 2013/0258762 | A1 | 10/2013 | Chih et al. |
| 2015/0206565 | A1 | 7/2015 | Aoki |

* cited by examiner

NONVOLATILE MEMORY DEVICE INCLUDING REFERENCE MEMORY CELL WITH FIXED STATE

CROSS-REFERENCE TO THE RELATED APPLICATION

This application claims priority from Korean Patent Application No. 10-2016-0151421, filed on Nov. 14, 2016, the entire disclosure of which is incorporated herein by reference.

BACKGROUND

Example embodiments of the inventive concept relate to semiconductor circuits, and more particularly, to a nonvolatile memory device.

A nonvolatile memory device is used as a main storing place in which a host such as a computer, a smart phone, a smart pad, etc. stores data for a long time. The nonvolatile memory device may be embodied in the form of a SSD (solid state drive), a memory card, an embedded memory, etc.

A nonvolatile memory device includes a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), an FRAM (ferroelectric RAM), etc.

As complexity and a size of circuits used in a nonvolatile memory device are reduced, manufacturing costs of the nonvolatile memory device are reduced. Thus, the demand for reducing complexity and a size of circuits used in the nonvolatile memory device has been raised.

SUMMARY

Example embodiments of the inventive concept provide a nonvolatile memory device. The nonvolatile memory device may include: first memory cells connected to a first source line and a first bit line; second memory cells connected to a second source line and a second bit line; and a sense amplifier circuit connected to the first and second source lines and the first and second bit lines, wherein the sense amplifier circuit comprises: a first sense amplifier configured to apply a first read voltage to the first bit line and output a first amount of a current flowing through a first memory cell selected from among the first memory cells; a second sense amplifier to apply a second read voltage configured to the second bit line and output a second amount of a current flowing through a second memory cell selected from among the second memory cells; and a comparator configured to compare the first amount of the current with the second amount of the current to identify data stored in the selected first memory cell, wherein the first read voltage has a level different from a level of the second read voltage.

Example embodiments of the inventive concept provide a nonvolatile memory device. The nonvolatile memory device may include: a plurality of memory cells connected to a plurality of source lines and a plurality of bit lines; a reference memory cell connected to a reference source line and a reference bit line; a plurality of sense amplifiers corresponding to the plurality of memory cells; a reference sense amplifier corresponding to the reference memory cell; and a plurality of comparators configured to compare an output of the reference sense amplifier with outputs of the plurality of sense amplifiers. Each of the sense amplifiers applies a first read voltage to a corresponding bit line and outputs information about a first amount of a current flowing through a corresponding memory cell as a first voltage. The reference sense amplifier applies a second read voltage to the reference bit line and outputs information about a second amount of a current flowing through the reference memory cell as a second voltage. The plurality of comparators compares the first voltage of the sense amplifiers with the second voltage of the reference sense amplifier to distinguish data stored in the plurality of memory cells. The first read voltage has a level different from a level of the second read voltage.

Example embodiments of the inventive concept provide a nonvolatile memory device. The nonvolatile memory device may include: a plurality of memory cells; a reference memory cell connected to the memory cells and configured to have a fixed logic state; a sense amplifier circuit configured to supply a read voltage to the memory cells and detect a signal indicating a current flowing through or a voltage drop occurring in each of the memory cells, and supply a reference read voltage to the reference memory cell and detect a reference signal indicating a current flowing through or a voltage drop occurring in the reference memory cell; and a comparator configured to compare the signal with the reference signal to determine data stored in the memory cells based on the fixed logic state of the reference memory cell.

BRIEF DESCRIPTION OF THE DRAWINGS

Example embodiments of the inventive concept will be described below in more detail with reference to the accompanying drawings. The example embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EXEMPLARY EMBODIMENTS

Figure 1:
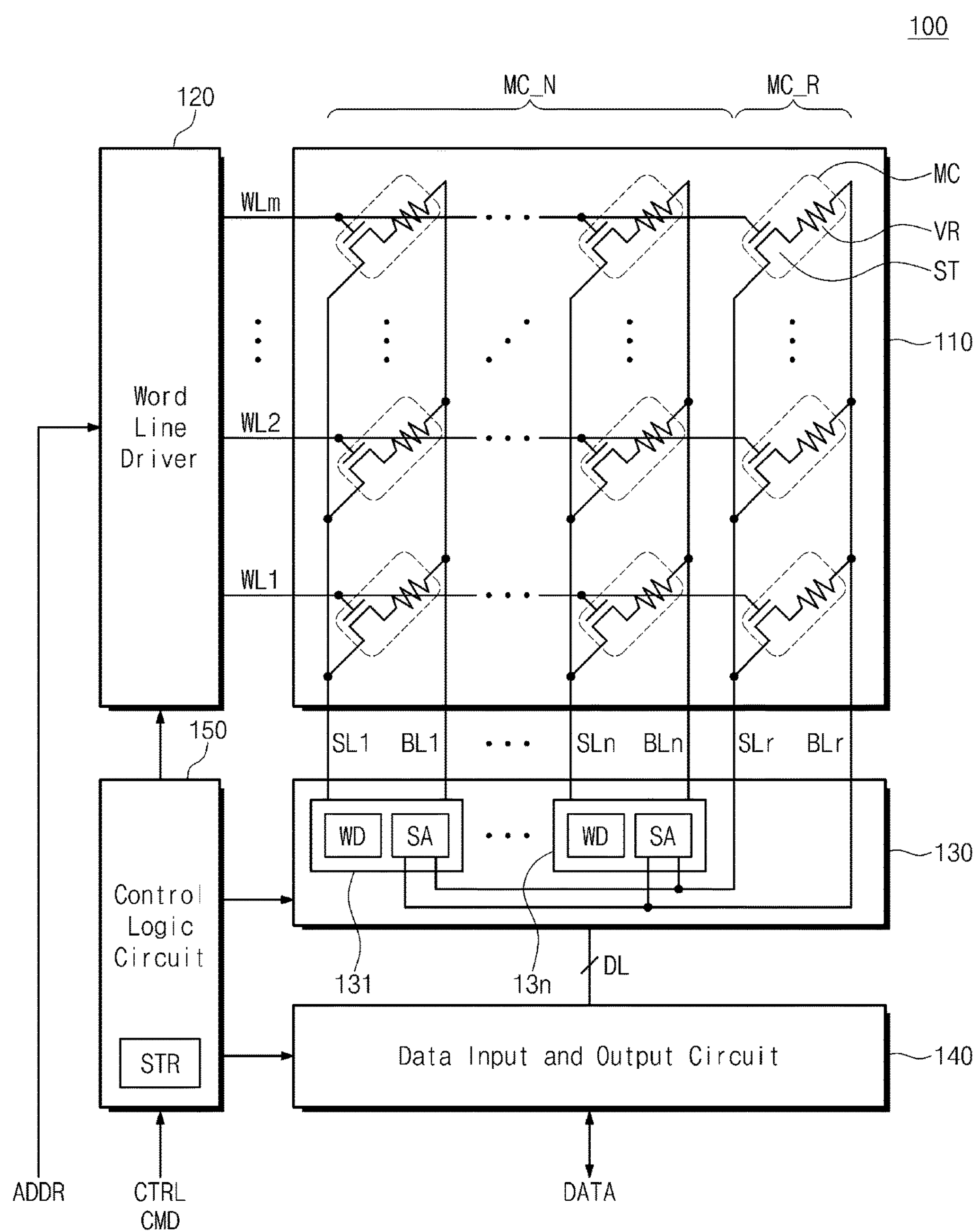
FIG. 1 is a block diagram illustrating a nonvolatile memory device, according to example embodiments of the inventive concept.

Example embodiments of the inventive concept will be described more fully hereinafter with reference to the accompanying drawings. This inventive concept may, however, be embodied in many different forms and should not be construed as limited to the example embodiments set forth herein. Rather, these example embodiments are provided so that this disclosure will be thorough and complete, and will fully convey the scope of the inventive concept to those skilled in the art. In the drawings, the size and relative sizes of layers and regions may be exaggerated for clarity like numbers refer to like elements throughout.

FIG. 1 is a block diagram illustrating a nonvolatile memory device 100 according to example embodiments of the inventive concept. Referring to FIG. 1, the nonvolatile memory device 100 may include a memory cell array 110, a word line driver 120, a write and read circuit 130, a data input and output circuit 140, and a control logic circuit 150.

The memory cell array 110 includes a plurality of memory cells MC. The memory cells MC are connected to source lines SL1 to SLn and SLr, bit lines BL1 to BLn and BLr, and word lines WL1 to WLm.

Each memory cell MC is connected to one source line, one bit line, and one word line. Each memory cell MC includes a variable resistor VR and a select transistor ST. The variable resistor VR and the select transistor ST are serially connected to each other. The variable resistor VR may be connected to a corresponding bit line, and the select transistor ST may be connected to a corresponding source line. On the contrary, the memory cells MC may be changed such that the variable resistor VR is connected to a corresponding source line, and the select transistor ST is connected to a corresponding bit line. A gate of the select transistor ST is connected to a corresponding word line.

Memory cells MC located at the same row may be connected to one word line in common. Memory cells MC located at the same column may be connected to one source line and one bit line.

The variable resistor VR may have a resistance value that varies depending on conditions of a voltage or a current being applied. For example, the variable resistor VR may include at least one of an MRAM (magnetic random access memory) cell, a PRAM (phase-change RAM) cell, an FRAM (ferroelectric RAM) cell, and an RRAM (resistive RAM) cell.

Memory cells MC connected to the first through nth source lines SL1 to SLn and the first through nth bit lines BL1 to BLn may be normal memory cells. The normal memory cells may be used to write data received from an external device. Each of the normal memory cells may have a resistance value corresponding to one of logic '1' and logic '0' according to a corresponding bit of data having been written.

Memory cells MC connected to the reference source line SLr and the reference bit line BLr may be used as reference memory cells. The reference memory cells are fixed to have a resistance value corresponding to one of logic '1' and logic '0'. The reference memory cells are used to provide reference information when reading data written in the normal memory cells.

The word line driver 120 is connected to the word lines WL1 to WLm. The word line driver 120 may receive an address ADDR from an external device (e.g., controller 200 (see FIG. 10)), and control voltages applied to the word lines WL1 to WLm according to the received address ADDR. For example, the word line driver 120 may apply an on-voltage that turns on select transistors ST to a word line designated as a target of write or read by the address ADDR, that is, a selected word line. The word line driver 120 may apply off-voltages that turn off select transistors ST to word lines not designated as a target of write or read by the address ADDR, that is, unselected word lines.

The write and read circuit 130 is connected to the source lines SL1 to SLn and SLr and the bit lines BL1 to BLn and BLr. The write and read circuit 130 may control voltages of the source lines SL1 to SLn and SLr and the bit lines BL1 to BLn and BLr to write data in the memory cells MC or read data written in the memory cells MC. That is, the write and read circuit 130 may control voltages of the source lines SL1 to SLn and SLr and the bit lines BL1 to BLn and BLr to adjust or read resistance values of the variable resistors VR of the memory cells MC.

The write and read circuit 130 includes a plurality of write and read blocks 131 to 13*n*. Each of the plurality of write and read blocks 131 to 13*n* corresponds to a column of the memory cells MC, and is connected to a source line and a bit line of the corresponding column. Each of the plurality of write and read blocks 131 to 13*n* is also connected to the reference source line SLr and the reference bit line BLr.

Each of the plurality of write and read blocks 131 to 13*n* connected to the source lines SL1 to SLn and SLr and the bit lines BL1 to BLn and BLr includes a write driver WD and a sense amplifier SA.

The write driver WD may receive data (or one or more bits) to be written in a memory cell MC from the data input and output circuit 140 through one of data lines DL. The write driver WD may control voltages (or currents) of a corresponding source line and a corresponding bit line so that data is written in the corresponding source line and the corresponding bit line.

The sense amplifier SA may control voltages (or currents) of the corresponding source line and the corresponding bit line such that a current flows through a memory cell selected by the word line driver 120 among memory cells connected to the corresponding source line and the corresponding bit line. The sense amplifier SA may control voltages (or currents) of the reference source line SLr and the reference bit line BLr so that a current flows through a memory cell (e.g., a reference memory cell) selected by the word line driver 120 among memory cells (e.g., reference memory cells) connected to the reference source line SLr and the reference bit line BLr. The sense amplifier SA may detect a signal (e.g., voltage or current) indicating an amount of a current that flows through the memory cell or an amount of a voltage drop that occurs in the memory cell. The sense amplifier SA may detect a signal indicating an amount of a current that flows through the reference memory cell or an amount of a voltage drop that occurs in the reference memory cell. The sense amplifier SA may identify data written in the memory cell by comparing the amount of the current that flows through the memory cell or the amount of the voltage drop that occurs in the memory cell with the amount of the current that flows through the reference memory cell or the amount of the voltage drop that occurs in the reference memory cell respectively.

The data input and output circuit 140 is connected to the write and read circuit 130 through the data lines DL. The data input and output circuit 140 may transmit data DATA received from an external device (e.g., controller 200 (refer to FIG. 10)) to the write and read circuit 130 through the data lines DL and may output data DATA received from the write and read circuit 130 through the data lines DL to the external device.

The control logic circuit 150 receives a control signal CTRL and a command CMD from the external device (e.g., controller 200 (see FIG. 10)). The control logic circuit 150 may control the word line driver 120, the write and read circuit 130, and the data input and output circuit 140 in response to the control signal CTRL and the command CMD. When performing a write operation or a read operation, the control logic circuit 150 may control timings when the word line driver 120, the write and read circuit 130, and the data input and output circuit 140 operate.

The control logic circuit 150 includes a storage circuit STR. The storage circuit STR may include a nonvolatile storage medium. For example, the storage circuit STR may include at least one of a laser fuse cut by a laser, an electrical fuse that operates electrically, nonvolatile memory cells, and one-time programmable (OTP) nonvolatile memory cells. The storage circuit STR may store information about various parameters used, during a read operation, by the write and read circuit 130. When power is turned on, the control logic circuit 150 may read information stored in the storage circuit STR and may set parameters associated with the read operation according to the read information.

Figure 2:
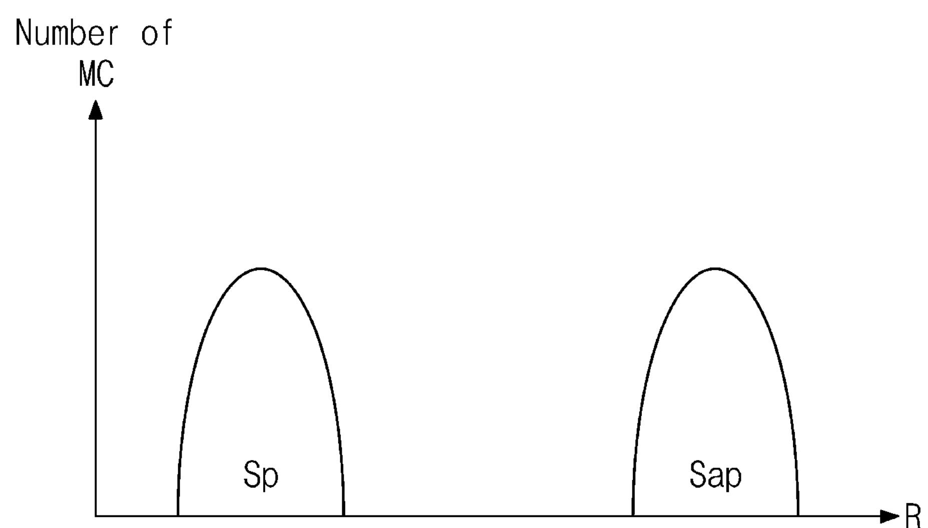
FIG. 2 illustrates resistance values of memory cells.

FIG. 2 illustrates resistance values of memory cells MC. In FIG. 2, a horizontal axis indicates a resistance value R and a vertical axis indicates the number of memory cells MC. That is, FIG. 2 illustrates a distribution of resistance values of the memory cells MC.

Referring to FIGS. 1 and 2, when one bit is written in each memory cell, the memory cells MC may have two states Sp and Sap. For example, the two states Sp and Sap may correspond to logic '1' and logic '0' respectively. If the number of bits written in each memory cell increases, the number of states of the memory cells MC may also increase.

When the memory cells MC are MRAM cells, the first state Sp having a low resistance value may be a parallel state where two magnetic layers are magnetized in parallel to each other. The second state Sap having a high resistance value may be an anti-parallel state where two magnetic layers are magnetize in anti-parallel to each other.

Normal memory cells connected to the source lines SL1 to SLn and the bit lines BL1 to BLn may be programmed in two states Sp and Sap depending on data to be written. The reference memory cells connected to the reference source line SLr and the reference bit line BLr may be fixed to have one of the two states Sp and Sap in common. For example, the reference memory cells may have only the first state Sp, and may not have the second state Sap in common. Alternatively, the reference memory cells may have only the second state Sap, and may not have the first state Sp in common.

Figure 3:
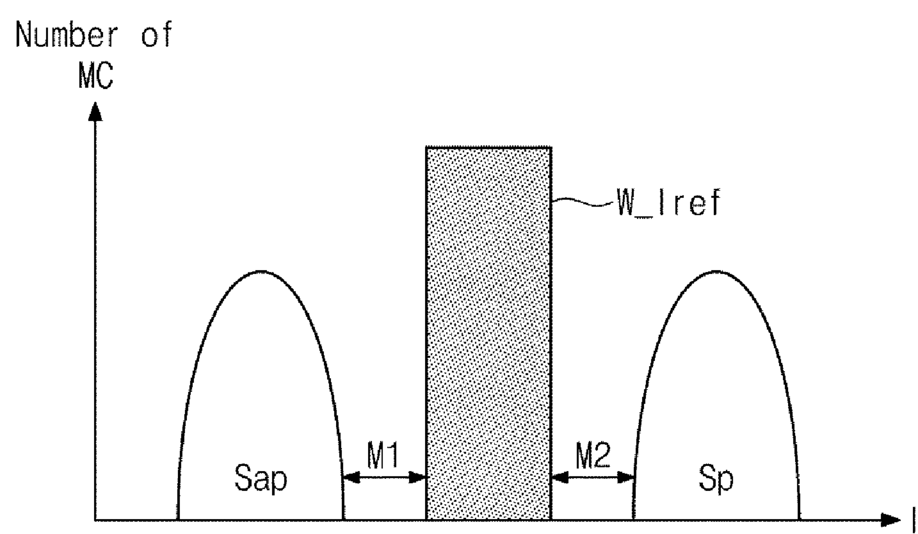
FIG. 3 illustrates amounts of currents flowing through memory cells when the same read voltages are applied to bit lines, according to example embodiments of the inventive concept.

FIG. 3 illustrates amounts of currents flowing through memory cells when the same read voltages are applied to bit lines. In FIG. 3, a horizontal axis indicates a current I and a vertical axis indicates the number of memory cells, for example, normal memory cells. That is, in FIG. 3, a distribution of amounts of currents of the normal memory cells is illustrated.

Referring to FIGS. 1 through 3, when the same read voltages are applied to the bit lines BL1 to BLn, the same reference voltages, for example, ground voltages are applied to the source lines SL1 to SLn and the select transistor ST are turned on, a current may flow through the normal memory cells. Resistance values of memory cells of the first state Sp are lower than resistance values of memory cells of the second state Sap. Thus, as illustrated in FIG. 3, an amount of a current that flows through a memory cell of the first state Sp is greater than an amount of a current that flows through a memory cell of the second state Sap.

As illustrated in FIG. 3, the resistance values of memory cells of the first state Sp and the resistance values of memory cells of the second state Sap may be set such that a range of amounts of currents that flow through the memory cells of the first state Sp and a range of amounts of currents that flow through the memory cells of the second state Sap do not overlap each other and are separated from each other.

If the sense amplifiers SA perform a sensing operation, amounts of currents (or voltages corresponding to the amounts of the current) that belong to the distribution range of the first state Sp illustrated in FIG. 3 are detected from the memory cells of the first state Sp and amounts of currents (or voltages corresponding to the amounts of the currents) that belong to the distribution range of the second state Sap illustrated in FIG. 3 are detected from the memory cells of the second state Sap. The sense amplifier SA may compare a reference signal (e.g., an amount of a reference current that flows through a reference memory cell or a voltage corresponding thereto) with a detected amount of a current flowing through a memory cell to determine a bit stored in the memory cell.

If the amounts of reference currents that flow through the reference memory cells belong to a reference current window (W_Iref), it may be determined that memory cells corresponding to amounts of currents greater than the amounts of the reference currents are in the first state Sp, and memory cells corresponding to amounts of currents smaller than the amounts of the reference currents are in the second state Sap. In order for the amounts of the reference currents to belong to the reference current window W_Iref when the reference memory cells are fixed to one of the first state Sp and the second state Sap, a reference read voltage applied to the reference bit line BLr by a reference sense amplifier SAr has to become different from read voltages applied to the bit lines BL1 to BLn by the sense amplifiers SA. Information about a level of the reference read voltage may be stored in the storage circuit STR.

The reference window W_Iref may be set to have a first margin M1 with respect to the amount of a current, e.g., a maximum current, of the second state Sap and a second margin M2 with respect to the amount of a current, e.g., a minimum current, of the first state Sp. The first margin M1 and the second margin M2 may be a spare current range which is set to prevent occurrence of an error in a read operation.

Figure 4:
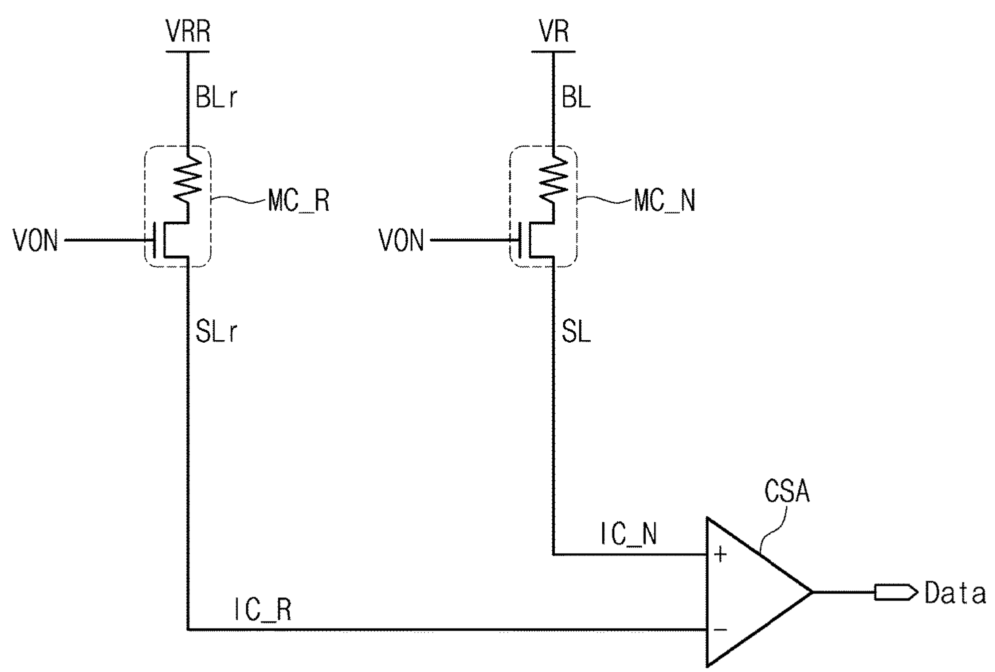
FIG. 4 illustrates an example where a part of a sense amplifier compares an amount of a current of a normal memory cell with an amount of a current of a reference memory cell, according to example embodiments of the inventive concept.

FIG. 4 illustrates an example which illustrates that a part SAa of the sense amplifier SA included in the write and read block 131 or **13*n* of the write and read circuit 130 (FIG. 1) compares an amount of a current of a normal memory cell MC_N with an amount of a current of a reference memory cell MC_R. Referring to FIGS. 1 and 4**, an on-voltage VON is applied to a word line connected to the normal memory cell MC_N and the reference memory cell MC_R. The sense amplifier SA may apply a read voltage VR to a bit line BL and may apply a reference read voltage VRR to the reference bit line BLr. A current that flows from the bit line BL to a source line SL through the normal memory cell MC_N may be a normal cell current IC_N. The normal cell current IC_N flows to a current sense amplifier CSA. A current that flows through the reference memory cell MC_R may be a reference cell current IC_R. The reference cell current IC_R flows to the current sense amplifier CSA.

The current sense amplifier CSA may detect an amount of the normal cell current IC_N and an amount of the reference cell current IC_R. The amount of each current may be detected in the form of an amount of a voltage drop. The current sense amplifier CSA may compare the amounts of the currents to output a comparison result as data.

A level of the reference read voltage VRR may be set such that the amount of the reference cell current IC_R to belong to the reference current window W_Iref. If the amount of the normal cell current IC_N is greater than the amount of the reference cell current IC_R, it may be determined that data written in the normal cell MC_N is in the parallel state Sp. The current sense amplifier CSA may output data indicating a parallel state. If the amount of the normal cell current IC_N is smaller than the amount of the reference cell current IC_R, it may be determined that data written in the normal cell MC_N is in the anti-parallel state Sap. The current sense amplifier CSA may output data indicating an anti-parallel state.

Figure 5:
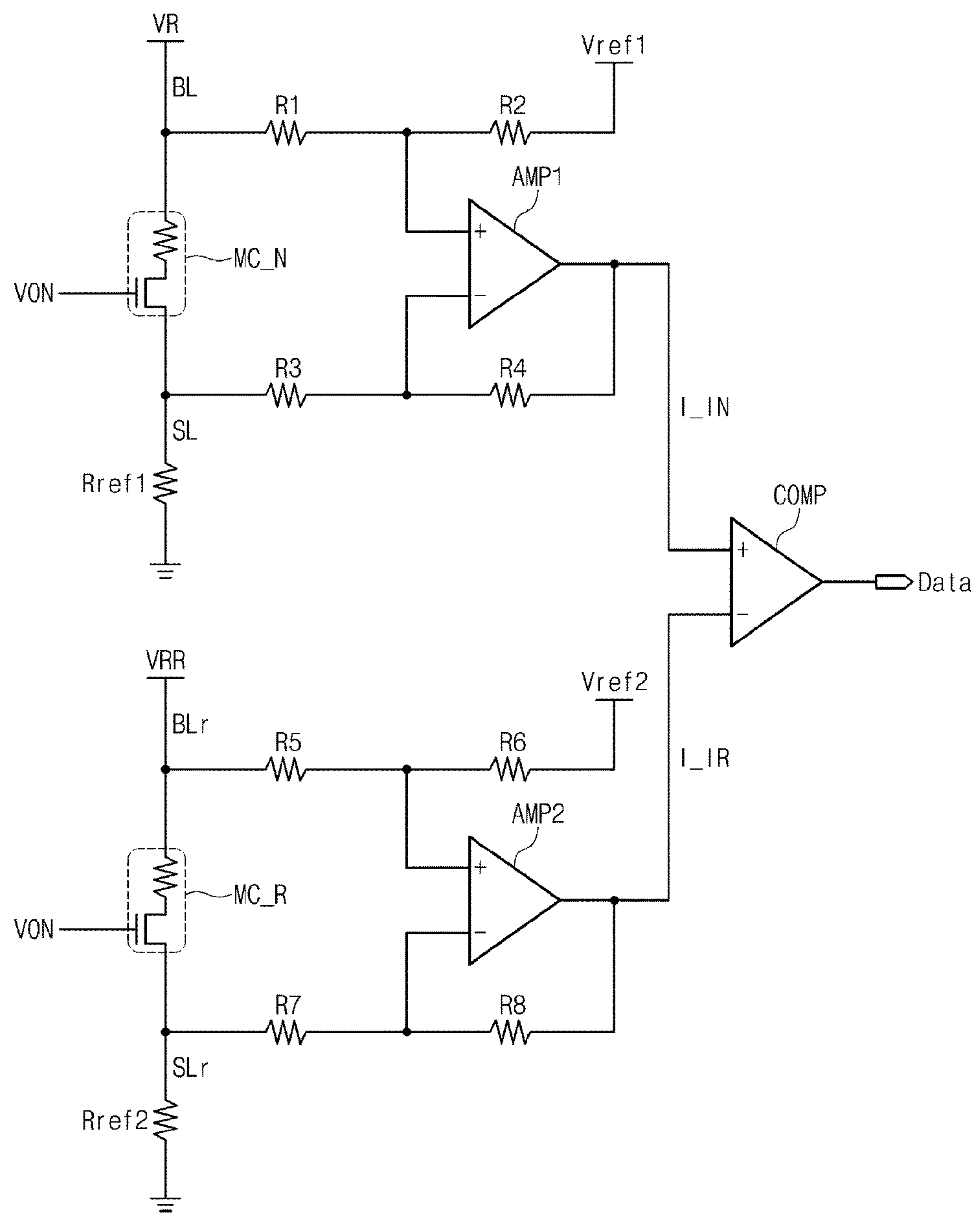
FIG. 5 illustrates a current sense amplifier, according to example embodiments of the inventive concept.

FIG. 5 illustrates the current sense amplifier CSA. Referring to FIGS. 1, 4 and 5, the current sense amplifier CSA includes first through eighth resistors R1 to R8, first and second reference resistors Rref1 and Rref2, first and second amplifiers AMP1 and AMP2, and a comparator COMP.

The first and second resistors R1 and R2 may be serially connected to each other. A node between the first and second resistors R1 and R2 may be connected to a positive input of the first amplifier AMP1. The first resistor R1 may be connected to a bit line BL. A first voltage Vref1 may be supplied to the second resistor R2. For example, resistance values of the first and second resistors R1 and R2 may be the same.

The third and fourth resistors R3 and R4 may be serially connected to each other. A node between the third and fourth resistors R3 and R4 may be connected to a negative input of the first amplifier AMP1. The third resistor R3 may be connected to a source line SL. The fourth resistor R4 may be connected to an output of the first amplifier AMP1. For example, resistance values of the third and fourth resistors R3 and R4 may be the same.

A reference voltage, for example, a ground voltage may be applied to the source line SL through the first reference resistor Rref1. The first reference resistor Rref1 may be a load resistor or a parasitic resistor.

An amount of a current that flows through the normal memory cell MC_N may be detected in the form of a voltage drop that occurs in the normal memory cell MC_N. The first amplifier AMP1 may amplify the voltage drop of the normal memory cell MC_N as much as a ratio of the first resistor R1 to the second resistor R2 or a ratio of the third resistor R3 to the fourth resistor R4 to output the amplified voltage drop as normal current amount information I_IN. The normal current amount information I_IN may have a voltage or current form. The normal current amount information I_IN is transmitted to the comparator COMP.

The fifth and sixth resistors R5 and R6 may be serially connected to each other. A node between the fifth and sixth resistors R5 and R6 may be connected to a positive input of the second amplifier AMP2. The fifth resistor R5 may be connected to a reference bit line BLr. A second voltage Vref2 may be supplied to the sixth resistor R6. For example, resistance values of the fifth and sixth resistors R5 and R6 may be the same.

The seventh and eighth resistors R7 and R8 may be serially connected to each other. A node between the seventh and eighth resistors R7 and R8 may be connected to a negative input of the second amplifier AMP2. The seventh resistor R7 may be connected to a reference source line SLr. The eighth resistor R8 may be connected to an output of the second amplifier AMP2. For example, resistance values of the seventh and eighth resistors R7 and R8 may be the same.

A reference voltage, for example, a ground voltage may be applied to the reference source line SLr through the second reference resistor Rref2. The second reference resistor Rref2 may be a load resistor or a parasitic resistor.

An amount of a current that flows through the reference memory cell MC_R may be detected in the form of a voltage drop that occurs in the reference memory cell MC_R. The second amplifier AMP2 may amplify the voltage drop of the reference memory cell MC_R as much as a ratio of the fifth resistor R5 to the sixth resistor R6 or a ratio of the seventh resistor R7 to the eighth resistor R8 to output the amplified voltage drop as reference current amount information I_IR. The reference current amount information I_IR may have a voltage or current form. The reference current amount information I_IR is transmitted to the comparator COMP.

The comparator COMP compares the normal current amount information I_IN with the reference current amount information I_IR to output a comparison result as data.

According to an example embodiment, the first to fourth resistors R1 to R4, the first amplifier AMP1 and the comparator COMP may form a normal sense amplifier, and the normal sense amplifier may be included in each of the sense amplifiers SA. The fifth to eighth resistors R5 to R8 and the second amplifier AMP2 may form a reference sense amplifier, and the reference sense amplifier may be included in each of the sense amplifiers SA. On the contrary, the reference sense amplifier may be provided in one of the sense amplifiers SA or outside of the sense amplifiers SA and may be used by the sense amplifiers in common.

Figure 6:
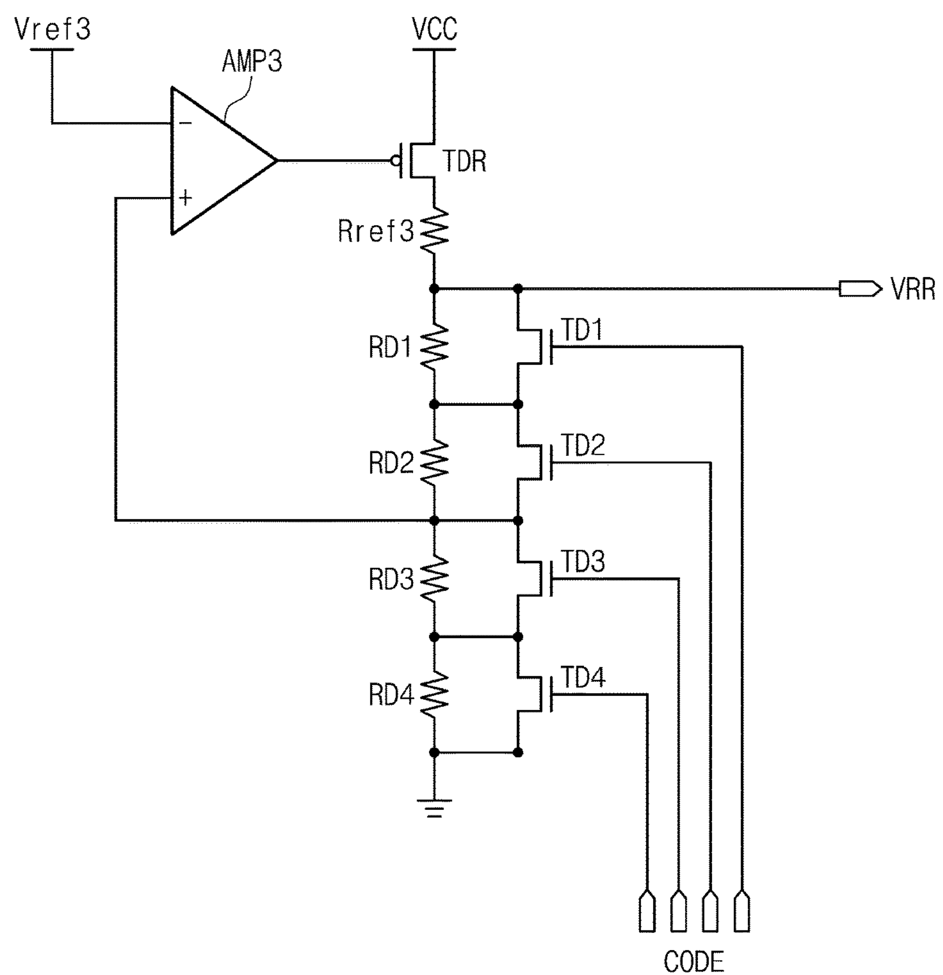
FIG. 6 illustrates an example where another part of a sense amplifier adjusts a reference read voltage, according to example embodiments of the inventive concept.

FIG. 6 illustrates an example which illustrates that another part Sab of the sense amplifier SA included in the write and read block 131 or 13*n* of the write and read circuit 130 (FIG. 1) adjusts a reference read voltage. Referring to FIGS. 1, 4 and 6, the sense amplifier part SAb includes first through fourth division resistors RD1 to RD4, a reference resistor Rref3, first through fourth division transistors TD1 to TD4, and an amplifier AMP3.

The first through fourth division resistors RD1 to RD4 may be sequentially connected to one another in series. The first through fourth division resistors RD1 to RD4 may be connected to the respective first through fourth division transistors TD1 to TD4 in parallel. The first through fourth division transistors TD1 to TD4 may be controlled by a code CODE.

The first through fourth division resistors RD1 to RD4 are connected between the reference resistor Rref3 and a ground node to which a ground voltage is supplied. A drive transistor TDR is connected between a node to which a power supply voltage VCC is supplied and the reference resistor Rref3. The drive transistor TDR may transmit the power supply voltage VCC to the reference resistor Rref3 and the first through fourth division resistors RD1 to RD4 in response to an output of the amplifier AMP3. A reference voltage Vref3 is supplied to a negative input of the amplifier AMP3 and a positive input of the amplifier AMP3 may be connected to a node between the second and third division resistors RD2 and RD3.

If at least one of the first through fourth division transistors TD1 to TD4 is turned on by the code CODE, a resistance value of the corresponding division resistor is not applied to divide the power supply voltage VCC. If at least one of the first through fourth division transistors TD1 to TD4 is turned off by the code CODE, a resistance value of the corresponding division resistor is applied to divide the power supply voltage VCC. That is, a first target voltage of a positive input of the amplifier AMP3 and a second target voltage of a reference read voltage VRR that are obtained by a division of the power supply voltage VCC may be decided by the code CODE.

When the reference read voltage VRR becomes lower than the second target voltage, a voltage of the positive input of the amplifier AMP3 becomes lower than the first target voltage. Thus, the amplifier AMP3 outputs a negative voltage. In response to an output of the amplifier AMP3, the drive transistor TDR expands a channel, and an amount of current supplied to the reference resistor Rref3 and the first through fourth division resistors RD1 to RD4 increases. That is, the reference read voltage VRR increases to the second target voltage.

When the reference read voltage VRR becomes higher than the second target voltage, a voltage of the positive input of the amplifier AMP3 becomes higher than the first target voltage. Thus, the amplifier AMP3 outputs a positive voltage. In response to an output of the amplifier AMP3, the drive transistor TDR reduces a channel, and an amount of current supplied to the reference resistor Rref3 and the first through fourth division resistors RD1 to RD4 is reduced. That is, the reference read voltage VRR falls to the second target voltage.

That is, even though amounts of currents flowing through the reference memory cells MC_R is changed, a level of the reference read voltage VRR may be maintained by the sense amplifier SAb.

The code CODE may include information about the target level of the reference read voltage VRR. The code CODE may be stored in the storage circuit STR, and may be read and used by the control logic circuit 150.

In FIG. 6, it was described that the code CODE controls the four division transistors TD1 to TD4. However, the number of division transistors and division resistors is not limited.

A level of a read voltage VR applied to the normal memory cells MC_N may also be controlled by the circuit illustrated in FIG. 6. Since the level of the read voltage VR is set to be different from the level of the reference voltage VRR, at least one of resistance values of resistors, levels of voltages, and a code CODE that are used to adjust the read voltage VR may be different from resistance values of resistors, levels of voltages, and a code CODE that are used to adjust the reference read voltage VRR.

As described above, the nonvolatile memory device 100 may distinguish data stored in the normal memory cells using only one reference memory cell corresponding to one state. Thus, the nonvolatile memory device 100 has reduced complexity and a reduced size in comparison with the related art nonvolatile memory devices using a reference memory cell(s) that stores different states.

Figure 7:
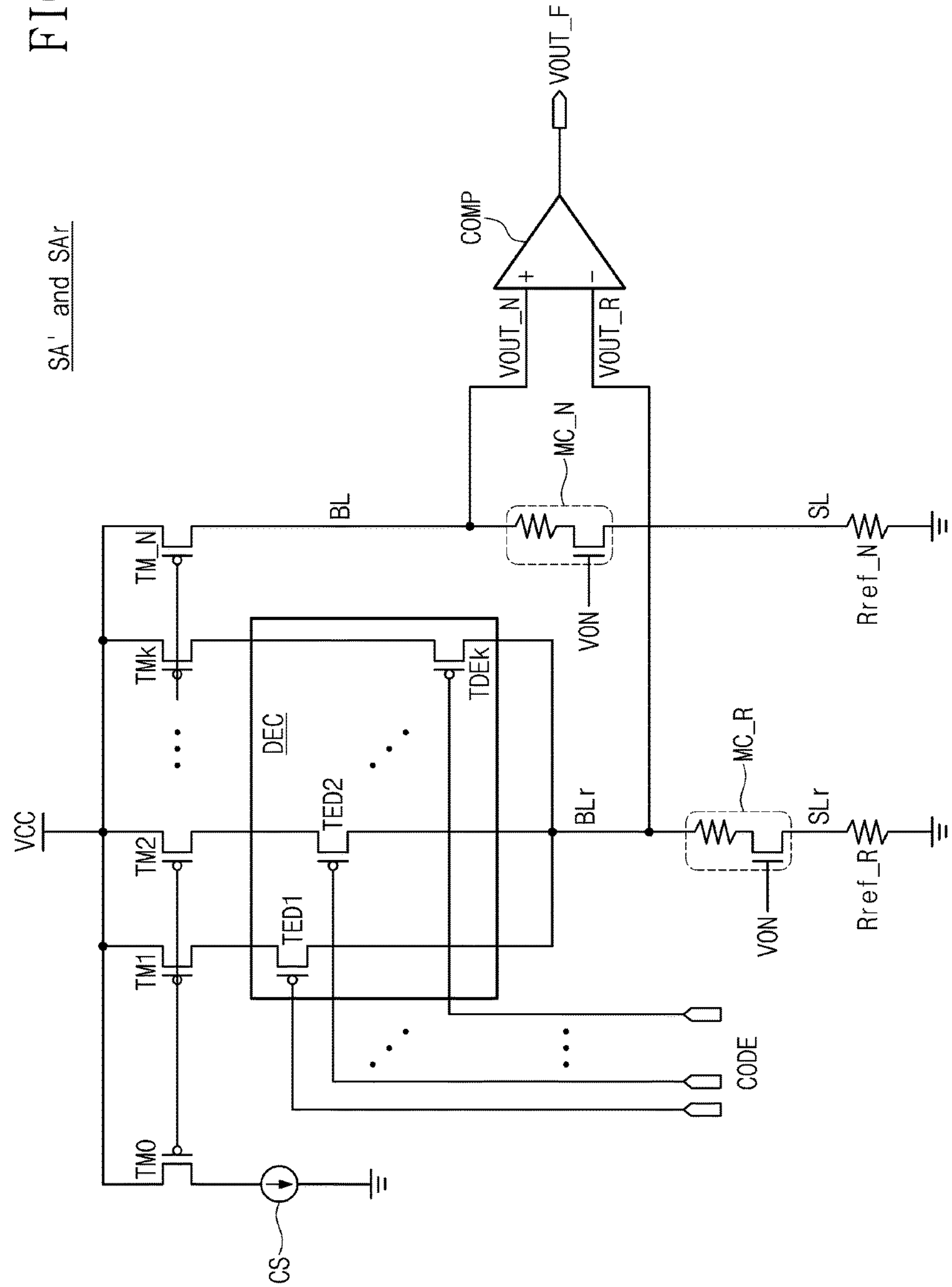
FIG. 7 illustrates an application example of a sense amplifier and a reference sense amplifier, according to example embodiments of the inventive concept.

FIG. 7 illustrates an application example of a sense amplifier. Referring to FIGS. 1, 4 and 7, a sense amplifier SA' and a reference sense amplifier SAr includes mirror transistors TM0 to TMk, a normal mirror transistor TM_N, a current source CS, a decoding block DEC, a reference resistor Rref_R, a normal reference resistor Rref_N, and a comparator COMP.

The mirror transistor TM0 is connected between a current source CS and a power supply node to which a power supply voltage VCC is supplied. A gate of the mirror transistor TM0 is connected to gates of the first through k-th mirror transistors TM1 to TMk and the normal mirror transistor TM_N in common.

The first through k-th mirror transistors TM1 to TMk are connected between the power supply node and the decoding block DEC in parallel. The decoding block DEC includes first through k-th decoding transistors TDE1 to TDEk that are serially connected to the first through k-th mirror transistors TM1 to TMk, respectively. The first through k-th decoding transistors TDE1 to TDEk may be turned on or turned off in response to a code CODE. The first through k-th decoding transistors TDE1 to TDEk may be connected to the reference bit line BLr in common.

The reference memory cell MC_R is connected to the reference bit line BLr and the reference source line SLr. A reference voltage (e.g., a ground voltage) may be supplied to the reference source line SLr through the reference resistor Rref_R. The reference resistor Rref_R may be a load resistor or a parasitic resistor.

According to an exemplary embodiment, the current source CS and the mirror transistor TM0 may be provided outside of the sense amplifier SA' and used by a plurality of sense amplifiers in common.

The first through k-th mirror transistors TM1 to TMk can mirror a current generated by the current source CS. An amount of the mirrored current may be decided by a ratio of a size (e.g., a width of a channel area where a channel is formed) of the mirror transistor TM0 to a size (e.g., a width of a channel area) of each of the first through k-th mirror transistors TM1 to TMk.

The first through k-th decoding transistors TDE1 to TDEk may supply the currents mirrored by the first through k-th mirror transistors TM1 to TMk to the reference bit line BLr or may block the mirrored currents in response to the code CODE. That is, the first through k-th decoding transistors TDE1 to TDEk may control an amount of the current supplied to the reference bit line BLr in response to the code CODE.

The normal mirror transistor TM_N can mirror a current generated by the current source CS to supply the mirrored current to the bit line BL. An amount of the mirrored current may be decided by a ratio of a size (e.g., a width of a channel area where a channel is formed) of the mirror transistor TM0 to a size (e.g., a width of a channel area) of the normal mirror transistor TM_N.

The sense amplifier SA' may supply currents to the normal memory cell MC_N and the reference memory cell MC_R, respectively. The comparator COMP may compare a reference output VOUT_R from the reference memory cell MC_R with a normal output VOUT_N from the normal memory cell MC_N to output a final output VOUT_F.

When a constant read current is supplied to the normal memory cells MC_N, a voltage distribution formed in the normal memory cells MC_N may be the same as that illustrated in FIG. 2. As illustrated in FIG. 3, if an amount (e.g., an amount of a reference read current) of a current supplied to the reference memory cell MC_R is adjusted to belong to the current window W_Iref by the code CODE, the comparator COMP may successfully identify data stored in the normal memory cell MC_N. The code CODE may be stored in the storage circuit STR.

According to an exemplary embodiment, the normal mirror transistor TM_N and the comparator COMP or the normal mirror transistor TM_N, the mirror transistor, the current source SC and the comparator COMP may form a normal sense amplifier, and the normal sense amplifier may be included in each of the sense amplifiers SA in FIG. 1. The first to k-th mirror transistors TM1 to TMk and the decoding block may form a reference sense amplifier, and the reference sense amplifier may be included in each of the sense amplifiers SA. On the contrary, the reference sense amplifier may be provided in one of the sense amplifiers SA or outside of the sense amplifiers SA, and may be used by the sense amplifiers in common.

Figure 8:
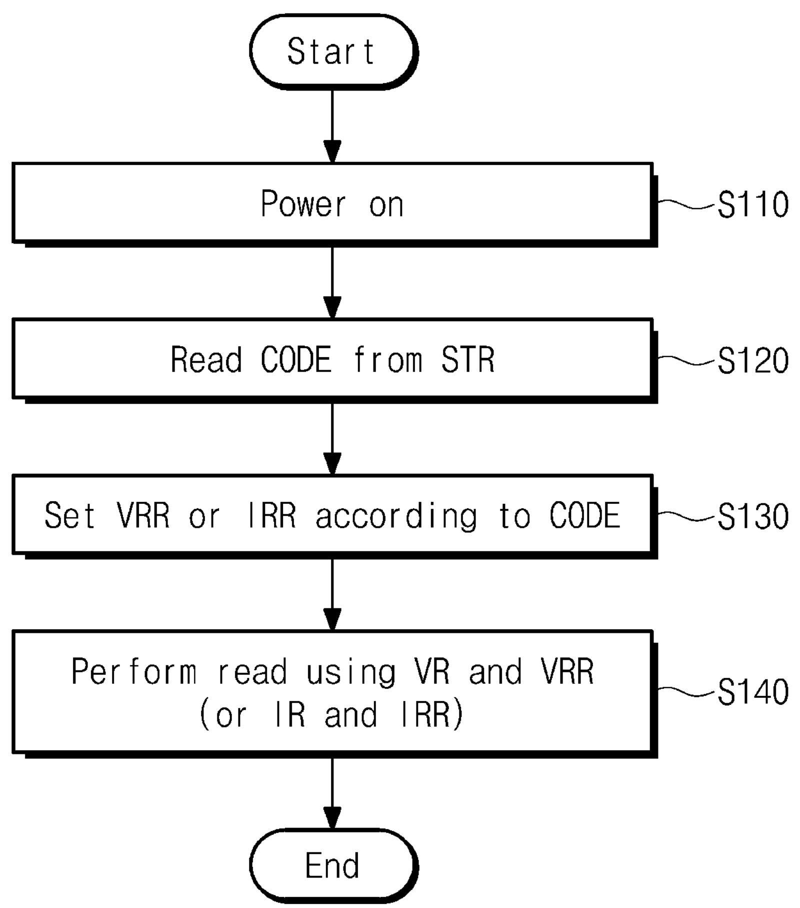
FIG. 8 is a flowchart illustrating a method of operating a nonvolatile memory device, according to example embodiments of the inventive concept.

FIG. 8 is a flowchart illustrating a method of operating a nonvolatile memory device 100, according to an example embodiment. Referring to FIGS. 1 and 8, in operation S110, the nonvolatile memory device 100 may be powered on.

In operation S120, the control logic circuit 150 may read a code CODE from the storage circuit STR. Then, in operation 130, The control logic circuit 150 may set a level of the reference read voltage VRR according to the code CODE. As another example, the control logic circuit 150 may set a level of the reference read current IRR according to the code CODE.

After a level of the reference read current is set, in an operation S140, the nonvolatile memory device 100 may perform a read operation using a normal read voltage VR and the reference read voltage VRR or using a normal read current IR and the reference read current IRR. The read operation may include a power-on-read operation performed after a power-on-reset. That is, the power-on read operation may also be performed after a level of the reference read voltage VRR or the reference read current IRR is adjusted by the code CODE of the storage circuit STR. Before the level of the reference read voltage VRR or the reference read current IRR is adjusted by the code CODE of the storage circuit STR, any type of read operation with respect to the normal memory cells MC_N may not be allowed.

Figure 9:
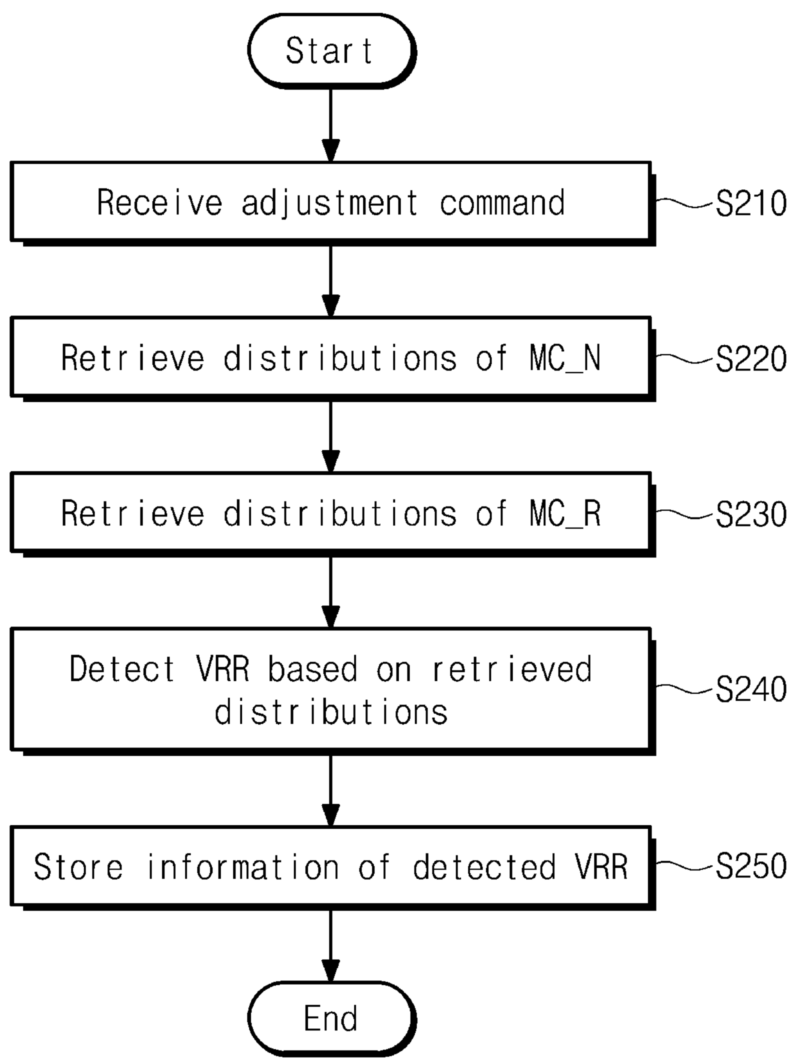
FIG. 9 is a flowchart illustrating an application example of a method of operating a nonvolatile memory device, according to example embodiments of the inventive concept.

FIG. 9 is a flowchart illustrating an application example of a method of operating a nonvolatile memory device. Referring to FIGS. 1 and 9, in an operation S210, the nonvolatile memory device 100 may receive an adjustment command. In response to the adjustment command, the nonvolatile memory device 100 may adjust (e.g., readjust) the reference read voltage VRR or the reference read current IRR.

In an operation S220, the control logic circuit 150 may retrieve a distribution of the normal memory cells MC_N, for example, a distribution of a current or a read current. For example, the control logic circuit 150 may retrieve a distribution from distribution information received together with an adjustment command or by performing a write operation and a read operation with respect to the normal memory cells MC_N. For example, the distribution of the current or the read current may correspond to a distribution of resistance values of the normal memory cells MC_N.

In an operation S230, the control logic circuit 150 may retrieve a distribution of the reference memory cells MC_R, for example, a distribution of the reference current or the reference read current. The control logic circuit 150 may retrieve a distribution from distribution information received together with an adjustment command or by performing a write operation and a read operation with respect to the reference memory cells MC_R. For example, the distribution of the reference current or the reference read current may correspond to a distribution of resistance values of the reference memory cells MC_R.

In an operation S240, the control logic circuit 150 may detect the reference read voltage VRR or the reference read current IRR based on the retrieved distributions. For example, the control logic circuit 150 may calculate the reference read voltage VRR or the reference read current IRR so that an amount of current or an amount of reference current belongs to the reference current window W_Iref of FIG. 3.

In an operation S250, the control logic circuit 150 may store information of the detected reference read voltage VRR or the detected reference read current IRR in the storage circuit STR.

When the information of the reference read voltage VRR or the reference read current IRR is received together with an adjustment command, the control logic circuit 150 may store the received information in the storage circuit STR without performing the operations S220 and S240.

Figure 10:
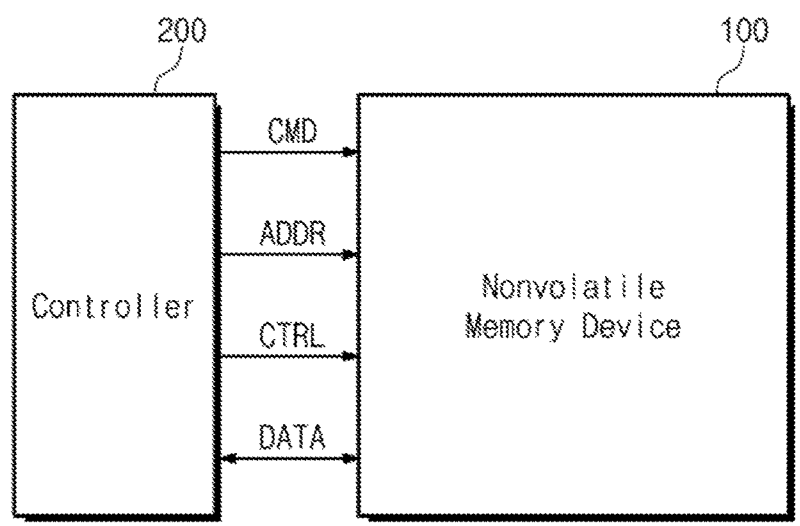
FIG. 10 is a block diagram illustrating a storage device including a nonvolatile memory device, according to example embodiments of the inventive concept.

FIG. 10 is a block diagram illustrating a storage device 10 including a nonvolatile memory device 100, according to example embodiments of the inventive concept. Referring to FIG. 10, the storage device 10 includes the nonvolatile memory device 100 and a controller 200. The controller 200 may transmit a command CMD, an address ADDR, and a control signal CTRL to the nonvolatile memory device 100 to control the nonvolatile memory device 100 to perform a read operation or a write operation. The controller 200 may exchange data with the nonvolatile memory device 100.

As described with reference to FIG. 9, the controller 200 may transmit an adjustment command to the nonvolatile memory device 100. The controller 200 may retrieve distributions by performing write operations and read operations in the nonvolatile memory device 100, and may transmit the retrieved distributions to the nonvolatile memory device 100 together with the adjustment command. The controller 200 may determine a level of the reference read voltage or the reference read current from the retrieved distributions, and may transmit the level information to the nonvolatile memory device 100 together with the adjustment command.

According to example embodiments of the inventive concept, data stored in a plurality of memory cells is distinguished using one reference memory cell. Thus, a nonvolatile memory device having reduced complexity and a reduced size is provided.

The contents described above are example embodiments for implementing the inventive concept. The inventive concept may include not only the example embodiments described above but also example embodiments in which a design is simply or easily capable of being changed. The inventive concept may also include technologies easily changed to be implemented using embodiments.

What is claimed is:

1. A nonvolatile memory device comprising:

first memory cells connected to a first source line and a first bit line;

second memory cells connected to a second source line and a second bit line; and a sense amplifier circuit connected to the first and second source lines and the first and second bit lines, wherein the sense amplifier circuit comprises:

a first sense amplifier configured to apply a first read voltage to the first bit line and output a first amount of a first current flowing through a first memory cell selected from among the first memory cells;

a second sense amplifier configured to apply a second read voltage to the second bit line and output a second amount of a second current flowing through a second memory cell selected from among the second memory cells;

a comparator configured to compare the first amount of the first current with the second amount of the second current to identify data stored in the selected first memory cell, wherein the first read voltage has a level different from a level of the second read voltage, and wherein the nonvolatile memory device further comprises a control logic circuit configured to receive an adjustment command from an external device and readjust the level of the second read voltage in response to the adjustment command, and wherein the control logic circuit retrieves a first distribution of first amounts of first currents of the first memory cells, retrieves a second distribution of second amounts of second currents of the second memory cells, and readjusts the level of the second read voltage according to the retrieved first and second distributions.

2. The nonvolatile memory device of claim 1, wherein each of the first memory cells has one of a resistance value that belongs to a first range and a resistance value that belongs to a second range different from the first range according to data stored in the first memory cells, and wherein each of the second memory cells has a resistance value that belongs to the same range of one of the first range and the second range.

3. The nonvolatile memory device of claim 1, wherein the first amount of the first current belongs to one of a first current range and a second current range depending on the data stored in the selected first memory cell, and wherein the second sense amplifier adjusts the second read voltage such that the second amount of the second current has a value between the first current range and the second current range.

4. The nonvolatile memory device of claim 3, wherein the comparator determines the data stored in the selected first memory cell depending on whether the first amount of the first current is greater or smaller than the second amount of the second current.

5. The nonvolatile memory device of claim 1, wherein the second sense amplifier amplifies a voltage drop formed in the selected second memory cell by the second amount of the second current, and provides the amplification result to the comparator as information about the second amount of the second current.

6. The nonvolatile memory device of claim 1, further comprising a storage circuit configured to store a code with respect to the level of the second read voltage, wherein the second sense amplifier adjusts the level of the second read voltage according to the code.

7. The nonvolatile memory device of claim 6, wherein the storage circuit comprises at least one of a laser fuse, an electrical fuse, nonvolatile memory cells, and one-time programmable (OTP) nonvolatile memory cells.

8. The nonvolatile memory device of claim 6, wherein the code is read in response to power being turned on, and wherein a read operation on the selected first memory cell is allowed after the level of the second read voltage is adjusted.

9. The nonvolatile memory device of claim 8, wherein the read operation comprises a power-on read operation for a power-on reset.

10. The nonvolatile memory device of claim 1, further comprising a nonvolatile storage circuit, wherein the control logic circuit is configured to store a code with respect to the readjusted level of the second read voltage in the nonvolatile storage circuit.

11. The nonvolatile memory device of claim 1, wherein the first distribution and the second distribution are retrieved by performing, under control of the control logic circuit, a write operation and a read operation with respect to the first memory cells and the second memory cells, or are provided from the external device together with the adjustment command.

12. The nonvolatile memory device of claim 1, further comprising a nonvolatile storage circuit, wherein the control logic circuit is configured to store a code with respect to the level of the second read voltage received together with the adjustment command in the nonvolatile storage circuit.

13. A nonvolatile memory device comprising:

a plurality of memory cells connected to a plurality of source lines and a plurality of bit lines;

a reference memory cell connected to a reference source line and a reference bit line;

a plurality of sense amplifiers corresponding to the plurality of memory cells;

a reference sense amplifier corresponding to the reference memory cell; and a plurality of comparators configured to compare an output of the reference sense amplifier with outputs of the sense amplifiers, wherein each of the sense amplifiers applies a first read voltage to a corresponding bit line, and outputs information about a first amount of a first current flowing through a corresponding memory cell as a first voltage, wherein the reference sense amplifier applies a second read voltage to the reference bit line, and outputs information about a second amount of a second current flowing through the reference memory cell as a second voltage, wherein the plurality of comparators compares the first voltage of the sense amplifiers with the second voltage of the reference sense amplifier to distinguish data stored in the plurality of memory cells, and wherein the first read voltage has a level different from a level of the second read voltage, wherein the nonvolatile memory device further comprises a control logic circuit configured to receive an adjustment command from an external device and readjust the level of the second read voltage in response to the adjustment command, and wherein the control logic circuit retrieves a distribution of first amounts of first currents of the plurality of memory cells, retrieves a second amount of the second current of the reference memory cell, and readjusts the level of the second read voltage according to the retrieved distribution and the retrieved second amount.

14. A nonvolatile memory device comprising:

a plurality of memory cells;

a reference memory cell connected to the memory cells and configured to have a fixed logic state;

a sense amplifier circuit configured to:

supply a read voltage to the memory cells and detect a signal indicating a current flowing through or a voltage drop occurring in each of the memory cells; and supply a reference read voltage to the reference memory cell and detect a reference signal indicating a current flowing through or a voltage drop occurring in the reference memory cell; and a comparator configured to compare the signal with the reference signal to determine data stored in the memory cells based on the fixed logic state of the reference memory cell, wherein the nonvolatile memory device further comprises a control logic circuit configured to receive an adjustment command from an external device and readjust a level of the reference read voltage in response to the adjustment command, and wherein the control logic circuit retrieves a first distribution of first amounts of first currents of the plurality of memory cells, retrieves a second amount of a second current of the reference memory cell, and readjusts the level of the read voltage according to the retrieved first distribution and the retrieved second amount.

15. The nonvolatile memory device of claim 14, wherein the fixed logic state is a logic low or a logic high.

16. The nonvolatile memory device of claim 14, wherein the nonvolatile memory device comprises a plurality of reference memory cells comprising the reference memory cell and sharing the same word lines with the plurality of memory cells, respectively, and wherein the plurality of reference memory cells are configured to have the same fixed logic state, based on which data stored in the memory cells are determined by comparing the signal with each of the reference signals indicating currents flowing through or voltage drops occurring in the reference memory cells.

17. The nonvolatile memory device of claim 14, further comprising a control logic circuit configured to control the level of the reference read voltage along with the sense amplifier such that the level of the reference read voltage is maintained regardless of change in an amount of a current flowing through the reference memory cell.

18. The nonvolatile memory device of claim 14, wherein the control logic circuit is further configured to allow a read operation on the memory cells by the sense amplifier comprising the supplying the read voltage and the reference read voltage to the memory cells and the reference memory cell only after the adjustment command is received.

* * * * *